(12) United States Patent
Liu

(10) Patent No.: US 6,621,704 B1
(45) Date of Patent: Sep. 16, 2003

(54) CLIP FOR HEAT SINK

(75) Inventor: HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/175,265

(22) Filed: Jun. 18, 2002

(30) Foreign Application Priority Data

Apr. 18, 2002 (TW) ...................................... 91205220 U

(51) Int. Cl.[7] ................................................. H05K 7/20
(52) U.S. Cl. ...................... 361/704; 361/707; 361/722; 257/718; 257/727; 174/16.3; 24/458; 248/510
(58) Field of Search ............................... 361/702–704, 361/707, 709, 717–719, 722; 165/80.3, 185; 174/16.3; 257/706, 707, 717–719, 722, 727; 24/457, 458; 248/505, 510, 316.7; 411/352, 516

(56) References Cited

U.S. PATENT DOCUMENTS

| | | | | |
|---|---|---|---|---|
| 5,371,652 A | * | 12/1994 | Clemens et al. | ............ 361/704 |
| 5,600,540 A | * | 2/1997 | Blomquist | .................. 361/704 |
| 5,617,292 A | * | 4/1997 | Steiner | ....................... 361/706 |
| 5,621,244 A | * | 4/1997 | Lin | ............................ 257/713 |
| 5,668,348 A | * | 9/1997 | Lin | ............................ 174/16.3 |
| 5,889,653 A | * | 3/1999 | Clemens et al. | ............ 361/704 |

* cited by examiner

*Primary Examiner*—Boris Chervinsky
(74) *Attorney, Agent, or Firm*—Wei Te Chung

(57) ABSTRACT

A clip (1) for securing a heat sink (10) to an electronic device includes a fastener (30) and a handle (40). The fastener includes a lower engaging portion (31), a horizontal U-shaped spring portion (32) extending from the engaging portion, and an inverted U-shaped suspending portion (33) extending from the spring portion. An opening (311) is defined in a lower part of the engaging portion. A horizontal slot (312) is defined in a middle part of the engaging portion. The handle comprises a horizontal base portion (41), a pair of parallel fingers (42) extending from one side of the base portion, and a pressing portion (43) extending from an opposite side of the base portion. The fingers of the handle are deformably received through the slot of the fastener, such that the handle is movably held in the fastener and cannot be accidentally disengaged therefrom.

15 Claims, 6 Drawing Sheets

CLIP FOR HEAT SINK

BACKGROUND OF THE INVENTION

1. Field of the Invention

The present invention relates to heat sink clips, and particularly to clips which are economical to manufacture and which securely attach a heat sink to an electronic device mounted on a circuit board.

2. Prior Art

Computer electronic devices such as central processing units (CPUs) frequently generate large amounts of heat. Oftentimes, a heat sink is attached onto a top surface of a CPU by using any of a variety of currently available clips. By removing heat from the CPU, the heat sink protects the CPU and associated components from instability and damage.

Referring to FIG. 6, a conventional clip comprises a central spring portion 101 and two legs 103 depending from opposite ends thereof. Each leg 103 defines an opening 105 engagably receiving a corresponding catch 107 formed on a side of a socket, to secure a heat sink 100 on an electronic device mounted on the socket. A pressing point of the clip acting on the heat sink generally coincides with a center of the clip.

Contemporary high-speed CPUs are generating more and more heat. Heat sinks are correspondingly being made larger and larger. As a result, it is now commonplace that the pressing point does not coincide with the center of the clip. This results in the heat sink and electronic device being prone to disengage when subjected to vibration or shock during normal use.

To solve the above problem, a pair of clips is often used to attach a heat sink to an electronic device. The heat sink is secured between a pair of retention modules. The clips abut against opposite sides of a base of the heat sink. Opposite legs of each clip engage with opposite sides of the corresponding retention module. However, because two clips are required, this solution is costly.

SUMMARY OF THE INVENTION

Accordingly, an object of the present invention is to provide a clip which securely attaches a heat sink to an electronic device.

Another object of the present invention is to provide a clip which is compact and economical to manufacture.

To achieve the above-mentioned object, a clip in accordance with the present invention comprises a fastener and a handle. The fastener includes a lower engaging portion, a horizontal U-shaped spring portion extending from the engaging portion, and an inverted U-shaped suspending portion extending from the spring portion. An opening is defined in a lower part of the engaging portion. A horizontal slot is defined in a middle part of the engaging portion. The handle comprises a horizontal base portion, a pair of parallel fingers extending from one side of the base portion, and a pressing portion extending from an opposite side of base portion. The fingers of the handle are deformably received through the slot of the fastener, such that the handle is movably held in the fastener and cannot be accidentally disengaged therefrom.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
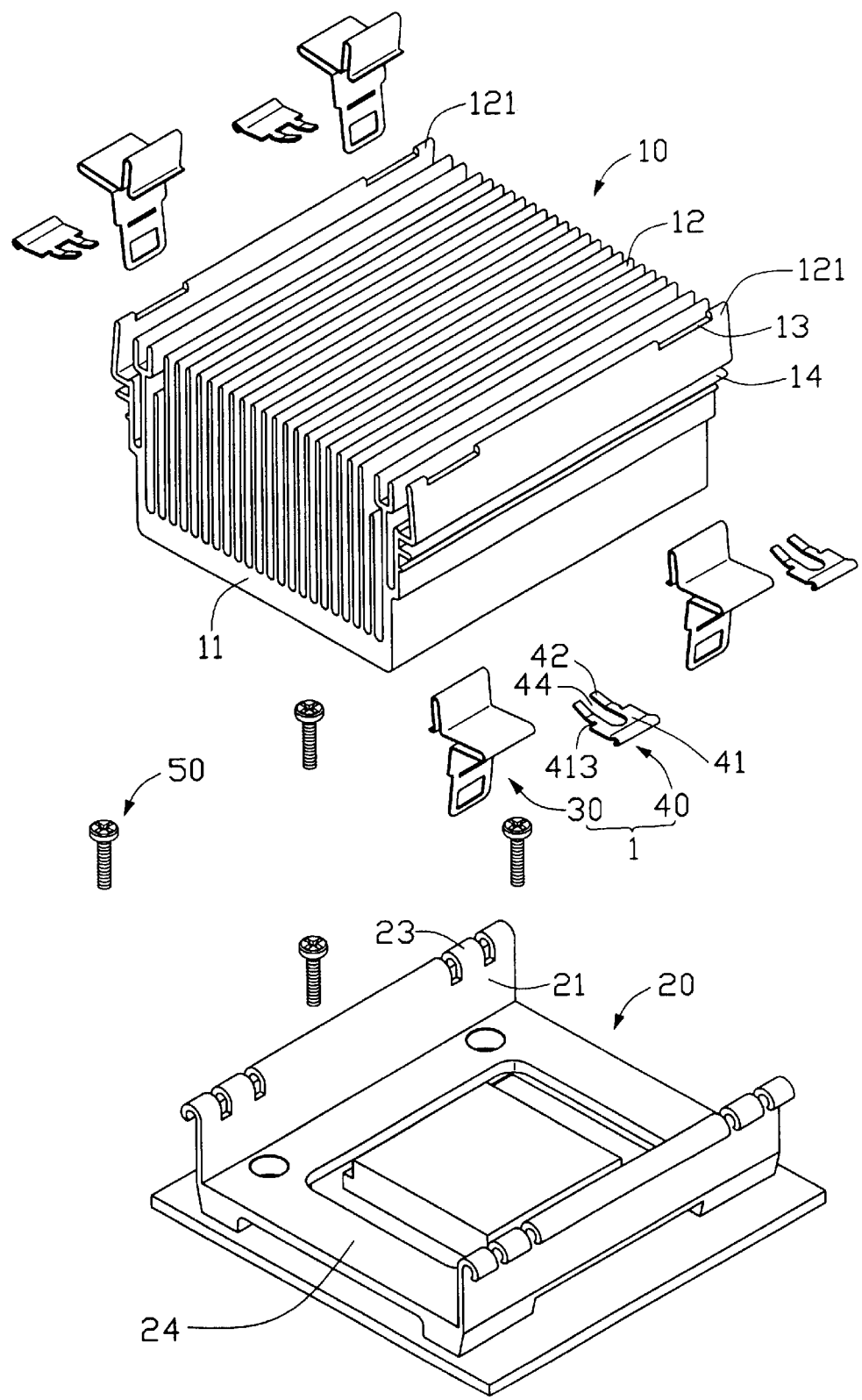
FIG. 1 is an exploded perspective view of four clips each of the present invention; together with a heat sink, and an electronic device and a retention module both mounted on a printed circuit board (PCB)

Referring to FIG. 1, four clips 1 each in accordance with the present invention can be used for attaching a heat sink 10 to an electronic device (not labeled) mounted on a printed circuit board (PCB) (not labeled). The clips 1 cooperate with a retention module 20 that is mounted on the PCB around the electronic device.

The heat sink 10 comprises a chassis 11, and a plurality of fins 12 extending vertically from a top surface of the chassis 11. A pair of shoulders 14 extends horizontally outwardly in opposite directions from opposite outmost fins 121 of the heat sink 10 respectively. A pair of spaced recesses 13 is defined in a top edge of each outmost fin 121.

The retention module 20 is secured on the PCB with four screws 50 or by other conventional means. The retention module 20 includes a rectangular base 24, and a pair of opposite side walls 21 extending upwardly from respective opposite sides of the base 24. Each side wall 21 has an inverted "J" shaped profile. A pair of spaced catches 23 is formed in an upper portion of each side wall 21.

Figure 2:
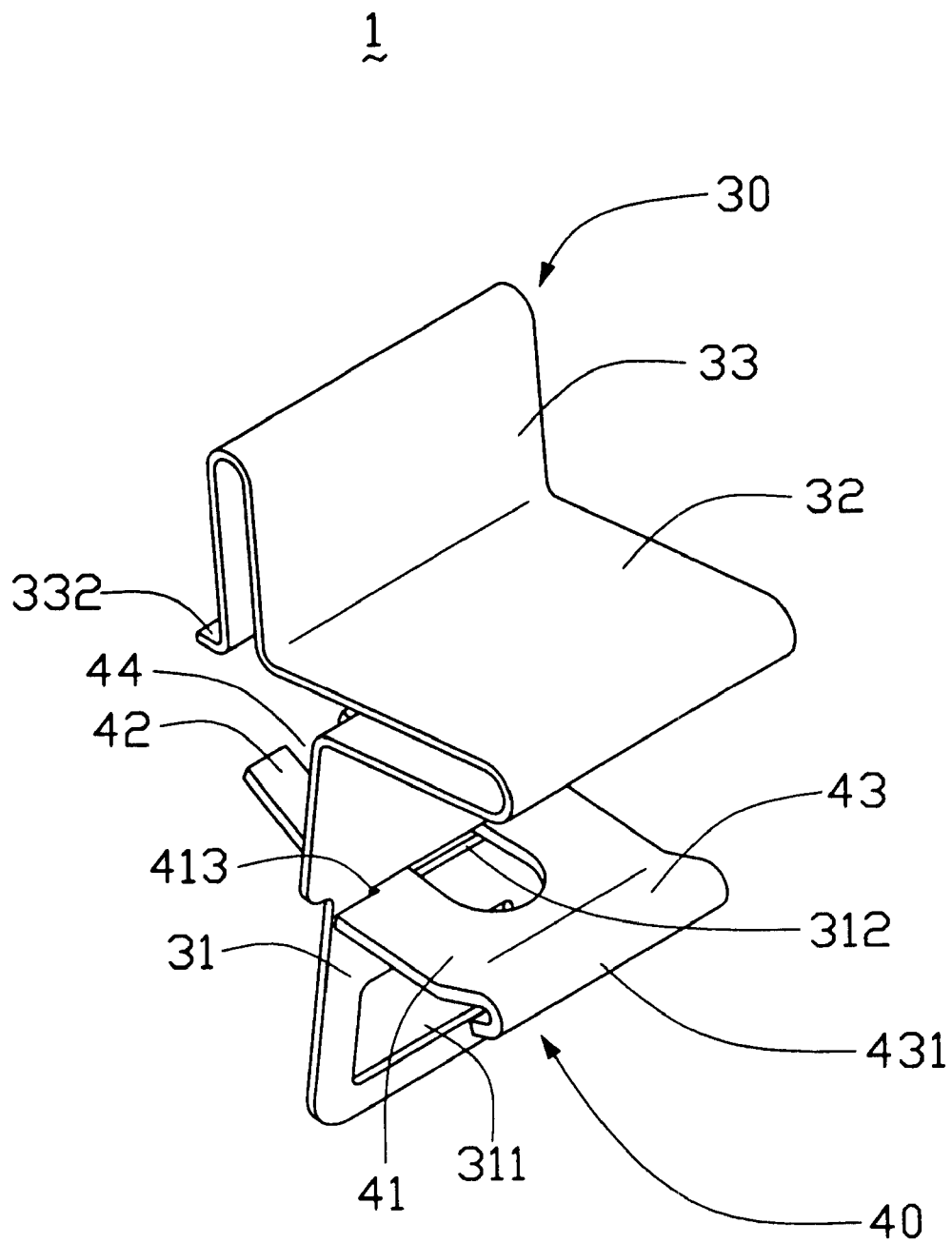
FIG. 2 is an enlarged assembled view of one of the clips of FIG. 1.

Referring also to FIG. 2, each clip 1 comprises a fastener 30 and a handle 40 attached to the fastener 30.

The fastener 30 includes a lower engaging portion 31, a horizontal U-shaped spring portion 32 extending from a top end of the engaging portion 31, and an inverted U-shaped suspending/abutting portion 33 extending from a distal end of the spring portion 32. An opening 311 is defined in a lower part of the engaging portion 31. A horizontal slot 312 is defined in a middle part of the engaging portion 31. A tab 332 is bent horizontally from a distal end of the suspending portion 33, to facilitate attachment of the suspending portion 33 to the corresponding outmost fin 121 of the heat sink 10 at the corresponding recess 13.

The handle 40 comprises a substantially horizontal base portion 41, a pair of parallel fingers 42 extending horizontally outwardly and then slightly upwardly from one side of the base portion 41, and a pressing portion 43 extending from an opposite side of the base portion 41. In the preferred embodiment, a width of the base portion 41 is greater than a corresponding total distance spanned by the fingers 42. Accordingly, the fingers 42 can pass through the slot 312 of the fastener 30, but the base portion 41 cannot. A pair of cutouts 413, around an joined portion with the fastener 30, is respectively defined in opposite outmost edges of the fingers 42 respectively, where the fingers 42 adjoin the base portion 41. A gap 44 is defined between the fingers 42 and through part of the base portion 41, to enable the handle 40 to elastically deform. The pressing portion 43 extends slightly upwardly from said opposite side of the base portion 41, and then doubles back under itself to form a rounded section 431. The rounded section 431 enables the handle 40 to be safely and comfortably manipulated.

Figure 3:
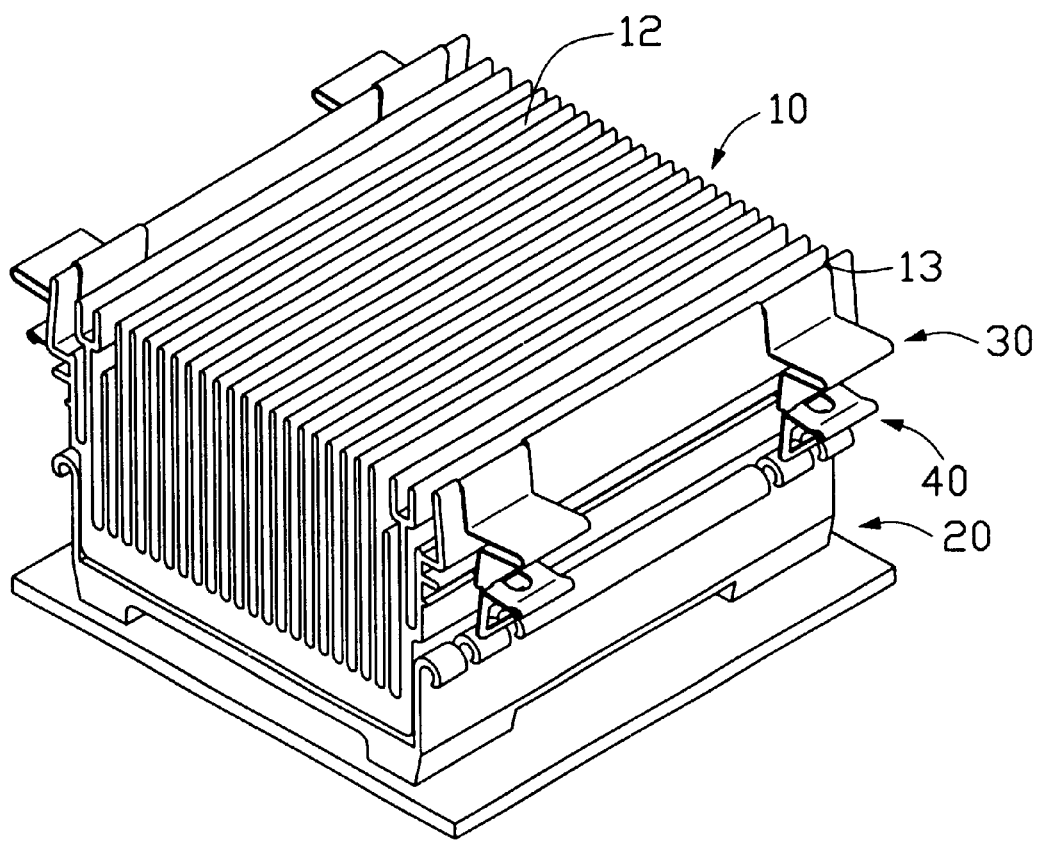
FIG. 3 is a partly assembled view of FIG. 1.
Figure 4:
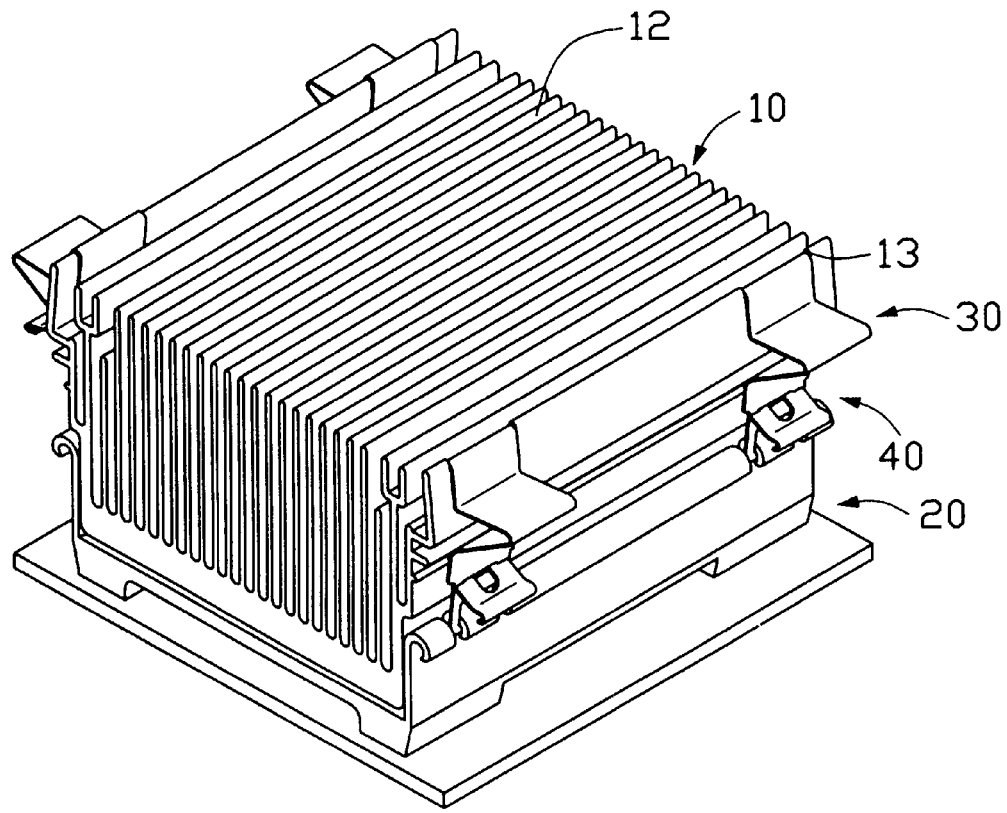
FIG. 4 is a fully assembled view of FIG. 1.
Figure 5:
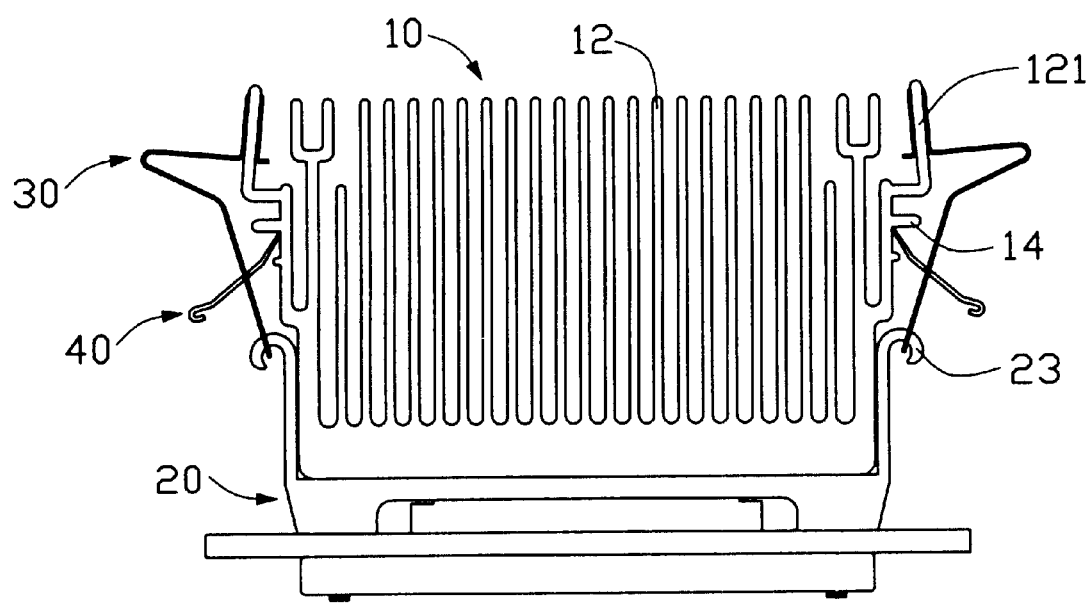
FIG. 5 is an front plan view of FIG. 4.
Figure 6:
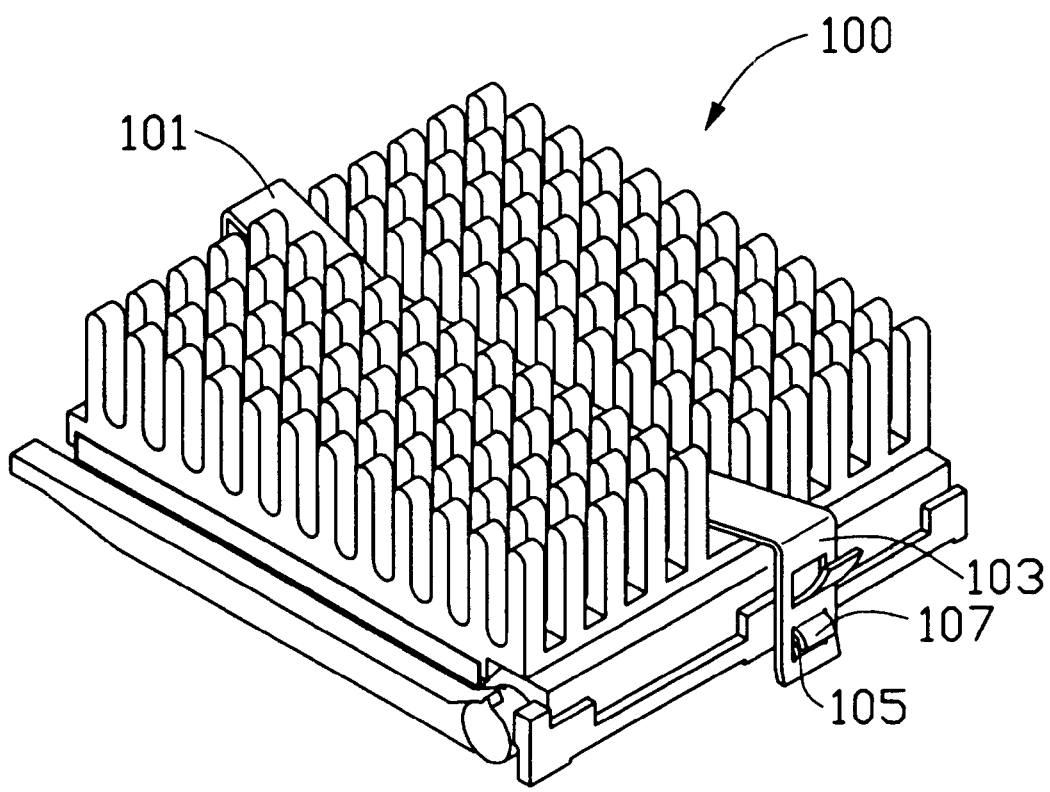
FIG. 6 is a perspective view of a conventional fastener attaching a heat sink onto an electronic device mounted on a socket.

Referring also to FIGS. 3 to 5, in assembly, the retention module 20 is mounted on the PCB with the screws 50. The retention module 20 surrounds the electronic device. T he heat sink 10 is placed on the electronic device, such that the recesses 13 of the heat sink 10 are aligned with the corresponding catches 23 of the retention module 20.

The suspending portions 33 of the fasteners 30 are attached onto the outmost fins 121 of the heat sink 10 at the corresponding recesses 13. Topmost sections of the suspending portions 33 are securely held in the recesses 13. The fingers 42 of each handle 40 are inserted into the slot 312 of each corresponding fastener 30. The fingers 42 resiliently deform until the cutouts 413 thereof snappingly receive the engaging portion 31 of the fastener 30 at opposite ends of the slot 312 respectively. The base portion 41 of the handle 40 abuts against the engaging portion 31, thus preventing the handle 40 from being over-inserted into the slot 312. The fingers 42 also abut against the engaging portion 31 at the cutouts 413, thus preventing the handle 40 from being accidentally withdrawn from the slot 312.

The pressing portion 43 of the handle 40 of each clip 1 is pressed downwardly. Distal ends of the fingers 42 of the handle 40, i.e., fulcrum ends, are thus rotatingly moved upwardly to engage with the corresponding shoulder 14 of the heat sink 10 where the shoulder 14 adjoins the corresponding outmost fins 121. The pressing portion 43 is continued to be pressed downwardly, whereby it rotates about the shoulder 14 where the shoulder 14 adjoins the outmost fin 121. The engaging portion 31 is thus moved downwardly, with the spring portion 32 of the fastener 30 being stretched. The opening 311 of the handle 30 receives the corresponding catch 23 of the retention module 20, and the engaging portion 31 is thus resiliently engaged with the catch 23 at a bottom extremity of the opening 311. The heat sink 10 is thereby securely fastened onto the electronic device by the clips 1.

It is understood that the invention may be embodied in other forms without departing from the spirit thereof. Thus, the present example and embodiment is to be considered in all respects as illustrative and not restrictive, and the invention is not to be limited to the details given herein. For example, the two opposite clips may be joined together with one handle equipped therewith.

What is claimed is:

1. An electronic device assembly comprising:
    a circuit board;
    an electronic device mounted on the circuit board;
    a retention module mounted on the circuit board around the electronic device and comprising a plurality of catches;
    a heat sink comprising a base contacting the electronic device, and a plurality of fins; and
    at least two clips, each of the clips comprising an integrally-formed fastener, the fastener comprises an engaging portion defining a slot, a spring portion arranged adjacent the engaging portion, and a suspending portion arranged adjacent the spring portion;
    wherein the suspending portion engages with a corresponding fin of the heat sink, and the engaging portion engages with a corresponding catch of the retention module, whereby the heat sink is attached to the electronic device.

2. The electronic device assembly as described in claim 1, wherein at least one recess is defined in a top of said corresponding fin of the heat sink.

3. The electronic device assembly as described in claim 1, wherein at least one shoulder extends from said corresponding fin of the heat sink.

4. The electronic device assembly as described in claim 1, wherein the retention module has a pair of side walls, and the catches are formed at the side walls.

5. The electronic device assembly as described in claim 1, wherein the spring portion is generally U-shaped.

6. The electronic device assembly as described in claim 2, wherein the suspending portion has a generally inverted U-shape, which engages with the at least one recess of said corresponding fin, and a tab is arranged at a distal end of the suspending portion.

7. The electronic device assembly as described in claim 1, wherein each of the clips further comprises a handle movably engaging in the slot of the engaging portion, for facilitating attachment or detachment of the clip.

8. The electronic device assembly as described in claim 7, wherein the handle comprises a base portion, a pair of fingers arranged adjacent one side of the base portion, and a pressing portion arranged adjacent an opposite side of the base portion.

9. The electronic device assembly as described in claim 8, wherein the fingers extend outwardly and slightly upwardly from said one side of the base portion.

10. The electronic device assembly as described in claim 8, wherein the pressing portion extends slightly upwardly from said opposite side of the base portion, and a rounded section is formed at a distal end of the pressing portion.

11. The electronic device assembly as described in claim 8, wherein a gap is defined between the fingers and through part of the base portion.

12. A heat sink assembly comprising:
    a printed circuit board;
    a module positioned on the printed circuit board with a heat generating device thereabouts and defining a pair of catches thereof;
    a heat sink positioned on the heat generating device;
    at least one clip including an abutting section engagingly abutting against the heat sink and around a lower portion thereof an engaging section latchably engaged with the corresponding catch, a joined section being defined between the abutting section and the engaging section; and
    a handle attached to the clip around thereof the joined section of the clip, and located between the abutting section and the engaging section; wherein
        said handle includes a distal end in abutment with a portion of the heat sink, and a manipulating portion located opposite to said distal end, said distal end and said manipulating portion being located by two sides of said joined section.

13. The assembly as described in claim 11, wherein said abutting section not only limits movements of said heat sink in a vertical direction but also in a horizontal direction.

14. The assembly as described in claim 11, further including another clip engaged with the heat sink and fastened to the other one of said pair of catches.

15. The assembly as described in claim 14, wherein said another clip is discrete from while in corporation with said clip to hold said heat sink unto the module.

* * * * *